US012610502B2

(12) United States Patent
Chang et al.

(10) Patent No.: US 12,610,502 B2
(45) Date of Patent: Apr. 21, 2026

(54) IMMERSION COOLING SYSTEM

(71) Applicant: Delta Electronics, Inc., Taoyuan City (TW)

(72) Inventors: Ren-Chun Chang, Taoyuan City (TW); Wei-Chih Lin, Taoyuan City (TW); Zih-Yang Fan, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 194 days.

(21) Appl. No.: 18/351,051

(22) Filed: Jul. 12, 2023

(65) Prior Publication Data

US 2024/0130080 A1 Apr. 18, 2024

Related U.S. Application Data

(60) Provisional application No. 63/417,084, filed on Oct. 18, 2022.

(30) Foreign Application Priority Data

Mar. 9, 2023 (CN) ......................... 202310222065.X

(51) Int. Cl.
*H05K 7/20* (2006.01)

(52) U.S. Cl.
CPC ......... *H05K 7/203* (2013.01); *H05K 7/20327* (2013.01)

(58) Field of Classification Search
CPC .......... H05K 7/20272; H05K 7/20781; H05K 7/203; H05K 7/20236; H05K 7/20327; H05K 7/20136
See application file for complete search history.

(56) References Cited

U.S. PATENT DOCUMENTS

| | | | | |
|---|---|---|---|---|
| 5,305,184 A | * | 4/1994 | Andresen | H05K 7/20872 361/720 |
| 5,523,064 A | * | 6/1996 | Schranz | B01D 9/0013 422/245.1 |

(Continued)

FOREIGN PATENT DOCUMENTS

| | | | | |
|---|---|---|---|---|
| CN | 110290677 A | * | 9/2019 | ......... H05K 7/20236 |
| TW | M325480 U | | 1/2008 | |
| TW | M618807 U | | 11/2021 | |

OTHER PUBLICATIONS

Extended Search Report of corresponding EP Application No. 23186495.0, issued on Mar. 1, 2024, 8 pages.

*Primary Examiner* — Frantz F Jules
*Assistant Examiner* — Martha Tadesse
(74) *Attorney, Agent, or Firm* — Muncy, Geissler, Olds & Lowe, P.C.

(57) ABSTRACT

An immersion cooling system is provided. It includes a pressure seal tank, an electronic module, a blower, and a distributor plate. The pressure seal tank contains a cooling liquid, and a gas outlet is disposed on the top or a sidewall of the pressure seal tank, a gas inlet is disposed on the bottom of the pressure seal tank. The gas outlet is higher than the liquid level of the cooling liquid. The electronic module is disposed in the pressure seal tank and immersed in the cooling liquid. The blower is communicated with the pressure seal tank and configured to extract the gas from the gas outlet and inject the gas into the pressure seal tank via the gas inlet. The distributor plate is disposed in the pressure seal tank and located between the electronic module and the gas inlet.

19 Claims, 3 Drawing Sheets

(56) References Cited

U.S. PATENT DOCUMENTS

| | | | |
|---|---|---|---|
| 10,020,242 B2 * | 7/2018 | Katsumata | ............. H01L 23/44 |
| 10,674,637 B2 | 6/2020 | Ishinabe | |
| 2014/0318741 A1 | 10/2014 | Jeffers et al. | |
| 2014/0321053 A1 * | 10/2014 | Donnelly | ........... H05K 7/20209 |
| | | | 361/691 |
| 2019/0008077 A1 * | 1/2019 | Ishinabe | ............ H05K 7/20736 |
| 2022/0087049 A1 * | 3/2022 | Smith | ................ H05K 7/20818 |
| 2022/0264761 A1 * | 8/2022 | Keehn | .................... H05K 7/203 |

* cited by examiner

100

IMMERSION COOLING SYSTEM

CROSS REFERENCE TO RELATED APPLICATIONS

This application claims the benefit of U.S. Provisional Application No. 63/417,084, filed Oct. 18, 2022, and claims priority of China Patent Application No. 202310222065.X, filed on Mar. 9, 2023, the entirety of which are incorporated by reference herein.

BACKGROUND OF THE INVENTION

Field of the Invention

The present invention relates to an immersion cooling system, and, in particular, to an immersion cooling system having a distributor plate disposed in the pressure seal tank.

Description of the Related Art

With the advance of technology, there are more applications for electronic apparatuses, and their widespread use has become more and more common. In particular, various communication apparatuses such as server apparatuses have gradually become an indispensable part of daily life. These electronic apparatuses generate a large amount of heat during operation, and therefore currently use immersion cooling systems. However, existing immersion cooling systems still have room for improvement in terms of operating cost and environmental performance.

In a traditional immersion cooling system, a high-density insulating cooling liquid is used, and the cooling liquid is driven to flow in a pressure seal tank by a pump device. However, due to the limited flow rate provided by the pump device and the large flow area required for the cooling liquid in the pressure seal tank, the flow rate of the cooling liquid flowing through the electronic module is relatively slow. In addition, due to the large viscosity coefficient of the cooling liquid (for example, it is about 10 times to 40 times that of water), the cooling liquid has insufficient fluidity, resulting in the cooling capacity of the immersion cooling system for the electronic module being insufficient. However, if a high-speed or large-capacity pump device is used to increase the fluidity of the cooling liquid, the operating costs will increase, and instead of saving energy, energy consumption will also increase.

Therefore, for the immersion cooling system, how to effectively take the operation cost and the heat dissipation performance into account, and achieve the effect of energy saving will be an important issue.

BRIEF SUMMARY OF THE INVENTION

An embodiment of the present invention provides an immersion cooling system. The immersion cooling system a pressure seal tank, an electronic module, a blower, and a distributor plate. The pressure seal tank contains a cooling liquid, and a gas outlet is disposed on the top or a sidewall of the pressure seal tank, a gas inlet is disposed on the bottom of the pressure seal tank. The gas outlet is higher than the liquid level of the cooling liquid. The electronic module is disposed in the pressure seal tank and immersed in the cooling liquid. The blower is communicated with the pressure seal tank and configured to extract the gas from the gas outlet and inject the gas into the pressure seal tank via the gas inlet. The distributor plate is disposed in the pressure seal tank and located between the electronic module and the gas inlet.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The supporting mechanisms of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

In addition, spatially relative terms, such as "lower," or "bottom," and "upper," or "top," may be used herein to describe one element or feature's relationship to another element or feature as illustrated in the figures. It should be understood that if the figures are turned upside-down, the element located on the "lower" side may become the element located on the "upper" side.

It should be appreciated that although the terms "first" and "second" may be used herein to describe various elements, materials and/or portions, these elements, materials and/or portions should not be limited by these terms. These terms are merely intended to distinguish different elements, materials and/or portions. Accordingly, a first element, material and/or portion discussed as follows may be referred to as a second element, material and/or portion without departing from the teaching of some embodiments in the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "about" or "approximately" may be recited herein, and are intended to encompass the circumstances or ranges that are substantially the same and exactly the same. It should be noted that unless specially defined, even if the above terms are not recited in the description, it should be interpreted as the same meaning as the above approximate terms that are recited.

Figure 1:
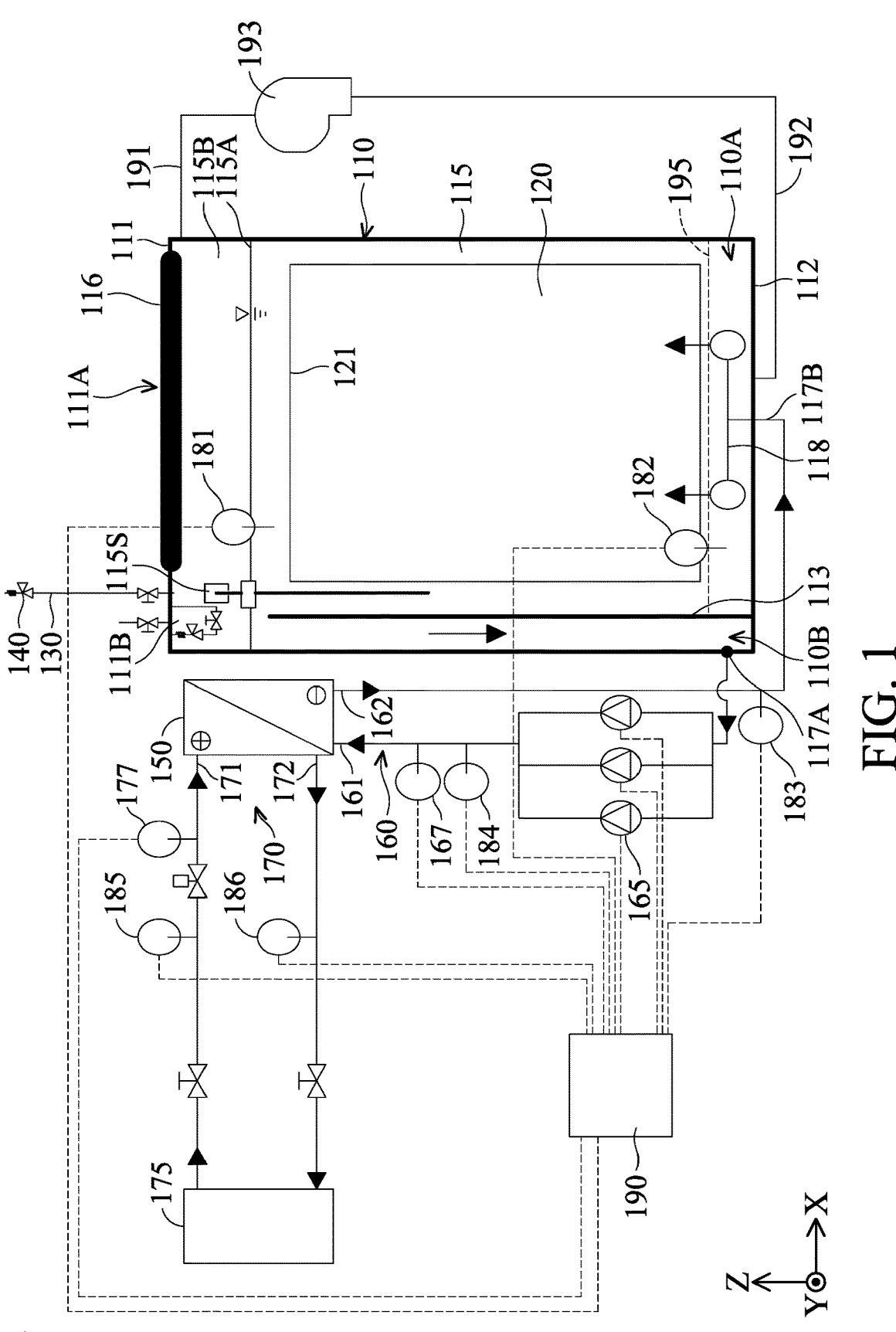
FIG. 1 illustrates a schematic view of an immersion cooling system in accordance with some embodiments of the present disclosure.

Referring to FIG. 1 first, FIG. 1 illustrates a schematic view of an immersion cooling system 100 in accordance with some embodiments of the present disclosure. In some embodiments, the immersion cooling system 100 may be provided, for example, for a server system, but the present disclosure is not limited thereto. As shown in FIG. 1, the immersion cooling system 100 may include a pressure seal tank 110, an electronic module 120, a pressure balance pipe 130 and a relief valve 140. In some embodiments, the pressure seal tank 110 may have a top surface 111, a bottom 112 and a partition wall 113. The partition wall 113 is vertically disposed on the bottom 112 in the pressure seal tank 110, so that the pressure seal tank 110 is divided into a first accommodating space 110A and a second accommodating space 110B inside. In some embodiments, the first accommodating space 110A is larger than the second accommodating space 110B, but the present disclosure is not limited thereto.

The pressure seal tank 110 may be configured to store the cooling liquid 115 and the electronic module 120. The cooling liquid 115 may be located in the first accommodation space 110A and the second accommodation space 110B at the same time. For example, the cooling liquid 115 may include fluorine-containing compounds or other suitable polymer compounds, but the present disclosure is not limited thereto. The electronic module 120 may be disposed in the first accommodating space 110A and completely immersed in the cooling liquid 115. As a result, the heat generated by the electronic module 120 can be taken away by the flow of the cooling liquid 115, so that the electronic module 120 can be kept at an appropriate working temperature, and therefore the failure probability of the electronic module 120 due to overheat can be reduced. For example, the electronic module 120 may include a plurality of electronic devices (such as server devices, which are not shown separately), but the present disclosure is not limited thereto.

In some embodiments, the height of the partition wall 113 is lower than the liquid level 115A and higher than the top surface 121 of the electronic module 120. In addition, the top surface 111 of the pressure seal tank 110 has an opening 111A, the opening 111A is adjacent to the pressure balance pipe 130 and can be communicated with the first accommodating space 110A. The electronic module 120 is placed into the pressure seal tank 110 through the opening 111A. The immersion cooling system 100 further includes a sealing cover 116 for sealing the opening 111A such that a vapor space 115B may be formed above the liquid level 115A of the cooling liquid 115.

In some embodiments, the vapor space 115B is formed above the liquid level 115A of the cooling liquid 115 in the pressure tight tank 110. More specifically, when the electronic module 120 is in operation, a portion of the cooling liquid 115 vaporizes, and the vapor is in the vapor space 115B. As a result, the saturated vapor pressure of the cooling liquid 115 will increase the pressure value (which is, for example, the sum of atmospheric pressure and the saturated vapor pressure of the cooling liquid 115) in the pressure seal tank 110.

In order to reduce the probability of damage to the pressure seal tank 110 due to an excessively high internal pressure, a relief valve 140 is provided to communicate with the pressure seal tank 110. By opening and closing the relief valve 140, the pressure value in the pressure seal tank 110 can be kept within an acceptable range. In the present embodiment, a pressure balance pipe 130 is connected between the relief valve 140 and the pressure seal tank 110. When the pressure value in the pressure seal tank 110 exceeds a first pressure value (for example, about 103 kPa), the relief valve 140 is automatically opened, so that the vapor space 115B is communicated with an environment outside the pressure seal tank 110 through the pressure balance pipe 130. Otherwise, when the pressure value inside the pressure seal tank 110 is lower than a second pressure value (for example, about 101.5 kPa), the relief valve 140 is automatically closed, so that the vapor space 115B is isolated from the environment outside the pressure seal tank 110. It should be understood that the first pressure value is greater than the second pressure value, and the pressure value in the pressure seal tank 110 can be kept between the first pressure value and the second pressure value with the above design.

Generally, the cooling liquid 115 used in the immersion cooling system 100 is a polymer fluoride. Once the cooling liquid 115 vaporizes, the vapor density of the cooling liquid 115 is about 10 to 25 times that of air. Therefore, after the cooling liquid 115 forms vapor and mixes with the air, because of the density difference between the vaporized cooling liquid 115 and the air, the vapor concentration of the cooling liquid 115 will gradually decrease as the height increases. The pressure balance pipe 130 is disposed between the top of the pressure seal tank 110 and the relief valve 140, and the height of the pressure balance pipe 130 can be designed according to the concentration distribution of the cooling liquid 115. As a result, once the relief valve 140 is opened to discharge gas (which includes air and the vapor of cooling liquid 115) for reducing the pressure value in the pressure seal tank 110, the gas can be discharged at a relatively high position with the arrangement of the pressure balance pipe 130, and therefore the vapor of cooling liquid 115 is discharged under a relatively low concentration. As mentioned above, the arrangement of the pressure balance pipe 130 may reduce the amount of vapor of the cooling liquid 115 discharged to the outside of the pressure seal tank 110 via the relief valve 140, thereby reducing the maintenance cost of the immersion cooling system 100.

In addition, the cooling liquid outlet 117A of the pressure seal tank is disposed at the bottom of the second accommodating space 110B, and is spatially opposite to (for example, facing) the partition wall 113. In some embodiments, the immersion cooling system 100 further includes a heat exchanger 150, and the heat exchanger 150 includes a cooling liquid circulation loop 160 and a water circulation loop 170. The cooling liquid circulation loop 160 has a cooling liquid inlet 161 of the heat exchanger and a cooling liquid outlet 162 of the heat exchanger. The cooling liquid inlet 161 of the heat exchanger may be connected to the cooling liquid outlet 117A of the pressure seal tank to receive cooling liquid 115 into heat exchanger 150. The water circulation loop 170 has an inlet pipe 171 and an outlet pipe 172, and the inlet pipe 171 may be connected to a cooling water source 175 to receive cold water into the heat exchanger 150. In this way, with the water circulation loop 170 and the cooling liquid circulation loop 160, the cooling liquid 115 may exchange heat with the cold water in the heat exchanger 150, so that the temperature of the cooling liquid 115 in the cooling liquid circulation loop 160 drops. After the heat exchange, the cooling liquid 115 may leave the cooling liquid circulation loop 160 via the cooling liquid outlet 162 of the heat exchanger, and the water may leave the water circulation loop 170 via the outlet pipe 172.

In some embodiments, the pump 165 is connected between the cooling liquid inlet 161 of the heat exchanger and the cooling liquid outlet 117A of the pressure seal tank in the cooling liquid circulation loop 160. In some embodiments, the pump 165 outputs propulsion so that the cooling liquid 115 in the second accommodating space 110B flows into the cooling liquid inlet 161 of the heat exchanger in the cooling liquid circulation loop 160 via the cooling liquid outlet 117A of the pressure seal tank. In addition, a liquid distributor 118 is disposed to connect between the cooling liquid outlet 162 of the heat exchanger in the cooling liquid circulation loop 160 and the bottom of the electronic module 120. After the cooling liquid 115 completes the heat exchange in the heat exchanger 150, the propulsion output by the pump 165 may make the cooling liquid 115 in the cooling liquid circulation loop 160 to flow into the liquid distributor 118 via the cooling liquid outlet 162 of the heat exchanger in the cooling liquid circulation loop 160 and the cooling liquid inlet 117B (for example, located at the bottom 112) of the pressure seal tank (i.e. the pressure seal tank 110). With the propulsion output by the pump 165, the liquid distributor 118 may evenly distribute the cooling liquid 115 into the first accommodating space 110A, flowing through the interior of the electronic module 120 (such as the surfaces of the plurality of electronic devices disposed therein).

As set forth above, due to the absorption of heat energy from the electronic module 120, the temperature of the cooling liquid 115 flowing through the electronic module 120 will rise. The heated cooling liquid 115 is less effective for cooling the electronic module 120. At this time, with the propulsion output by the pump 165, the heated cooling liquid 115 will flow over the partition wall 113 to the second accommodating space 110B, and pass through the cooling liquid outlet 117A of the pressure seal tank to the heat exchanger 150 for heat exchange (cooling). Then, the cooled cooling liquid 115 will enter the liquid distributor 118 via the cooling liquid inlet 117B of the pressure seal tank, and re-inject into the pressure-tight tank 110 to complete the circulation of the cooling liquid 115. In this way, the re-injected cooling liquid 115 may regain the effect of cooling the electronic module 120.

In some embodiments, a first flow meter 167 may be disposed between the cooling liquid inlet 161 of the heat exchanger in the cooling liquid circulation loop 160 and the pump 165 to detect whether the flow rate of the cooling liquid 115 is within an acceptable range. Similarly, a second flow meter 177 may be disposed between the inlet pipe 171 of the water circulation loop 170 and the water tower 175 to detect whether the flow rate of the cold water is within an acceptable range. The immersion cooling system 100 has a controller 190. When the controller 190 detects that the flow rate of the cooling liquid 115 and/or the cooling water exceeds a threshold value, the controller 190 will output a warning signal to notify the personnel to check that the pipelines are well-connected.

In some embodiments, the immersion cooling system 100 further includes a first temperature sensor 181 that is disposed on the top of the electronic module 120 and configured to detect the first temperature of the cooling liquid 115. In addition, the immersion cooling system 100 further includes a second temperature sensor 182 that is disposed at the bottom of the electronic module 120 and configured to detect the second temperature of the cooling liquid 115. The controller 190 of the immersion cooling system 100 may obtain a first temperature difference between the first temperature and the second temperature. Specifically, the above-mentioned first temperature difference may represent a temperature difference before and after the cooling liquid 115 flows through the electronic module 120 (that is, before and after the cooling liquid 115 exchanges heat with the electronic module 120). In some embodiments, when the controller 190 detects that the first temperature difference is less than or equal to a temperature threshold, the controller 190 reduces the output propulsion of the pump 165. In this way, unnecessary circulation of the cooling liquid 115 can be reduced, thereby reducing the operating cost of the immersion cooling system 100.

Furthermore, the immersion cooling system 100 further includes a third temperature sensor 183 that is disposed on the pipeline connecting the cooling liquid outlet 162 of the heat exchanger in the cooling liquid circulation loop 160 and the liquid distributor 118, and is configured to detect a third temperature of the cooling liquid 115. The immersion cooling system 100 further includes a fourth temperature sensor 184 that is disposed on the pipeline connecting the cooling liquid inlet 161 of the heat exchanger in the cooling liquid circulation loop 160 and the pump 165, and is configured to detect a fourth temperature of the cooling liquid 115. In this way, if the controller 190 fails to obtain the first temperature difference between the first temperature and the second temperature (for example, the first temperature sensor 181 or the second temperature sensor 182 is damaged), the controller 190 may obtain the second temperature difference between the third temperature and the fourth temperature as a back-up plan. When the controller 190 detects that the second temperature difference is less than or equal to the temperature threshold, the controller 190 reduces the propulsion output by the pump 165. As a result, unnecessary circulation of the cooling liquid 115 can be reduced, thereby reducing the operating cost of the immersion cooling system 100.

In some embodiments, the immersion cooling system 100 further includes a fifth temperature sensor 185 that is disposed on the inlet pipe 171 of the water circulation loop 170 (that is, located between the heat exchanger 150 and the cooling water source 175), and is configured to detect a fifth temperature of the water. The immersion cooling system 100 further includes a sixth temperature sensor 186 that is disposed on the outlet pipe 172 of the water circulation loop 170 (that is, located between the heat exchanger 150 and the cooling water source 175), and is configured to detect a sixth temperature of the water. If the controller 190 fails to obtain the first temperature difference and the second temperature difference, the controller 190 obtains a third temperature difference between the fifth temperature and the sixth temperature as a back-up plan. When the controller detects that the third temperature difference is less than or equal to the temperature threshold, the controller 190 reduces the propulsion output by the pump 165. As a result, unnecessary circulation of the cooling liquid 115 can be reduced, thereby reducing the operating cost of the immersion cooling system 100.

In some embodiments, the immersion cooling system 100 further includes a water-level sensor 115S for detecting the position of the liquid level 115A of the cooling liquid 115. The controller 190 can detect whether the liquid level is lower than the top surface 121 of the electronic module (i.e. the electronic module 120) by using the water-level sensor 115S. When the controller 190 detects that the liquid level 115A is lower than the top surface 121 of the electronic module (i.e. the electronic module 120), the controller 190 will output a warning signal to notify the personnel to replenish the cooling liquid 115 to maintain the cooling effect on the electronic module 120.

In addition, in this embodiment, the immersion cooling system 100 includes a blower 193, wherein the blower 193 communicates with the pressure seal tank 110 via the gas outlet 191 at the top of the pressure seal tank 110 and the gas inlet 192 at the bottom of the pressure seal tank 110. Specifically, the blower 193 can extract gas from the gas outlet 191 and inject the extracted gas back into the pressure seal tank 110 through the gas inlet 192. In addition, the immersion cooling system 100 also includes a distributor plate 195 that is disposed in the pressure seal tank 110, and the distributor plate 195 is located between the electronic module 120 and the gas inlet 192. In some embodiments, the distributor plate 195 is disposed parallel to the bottom surface of the pressure seal tank 110, but the present disclosure is not limited thereto. In this way, gas circulation can be formed in the pressure seal tank 110. The flow of the gas from bottom to top can increase the fluidity of the cooling liquid 115 (for example, increase the flow rate), thereby significantly improving the heat dissipation effect on the electronic module 120.

Figure 2:
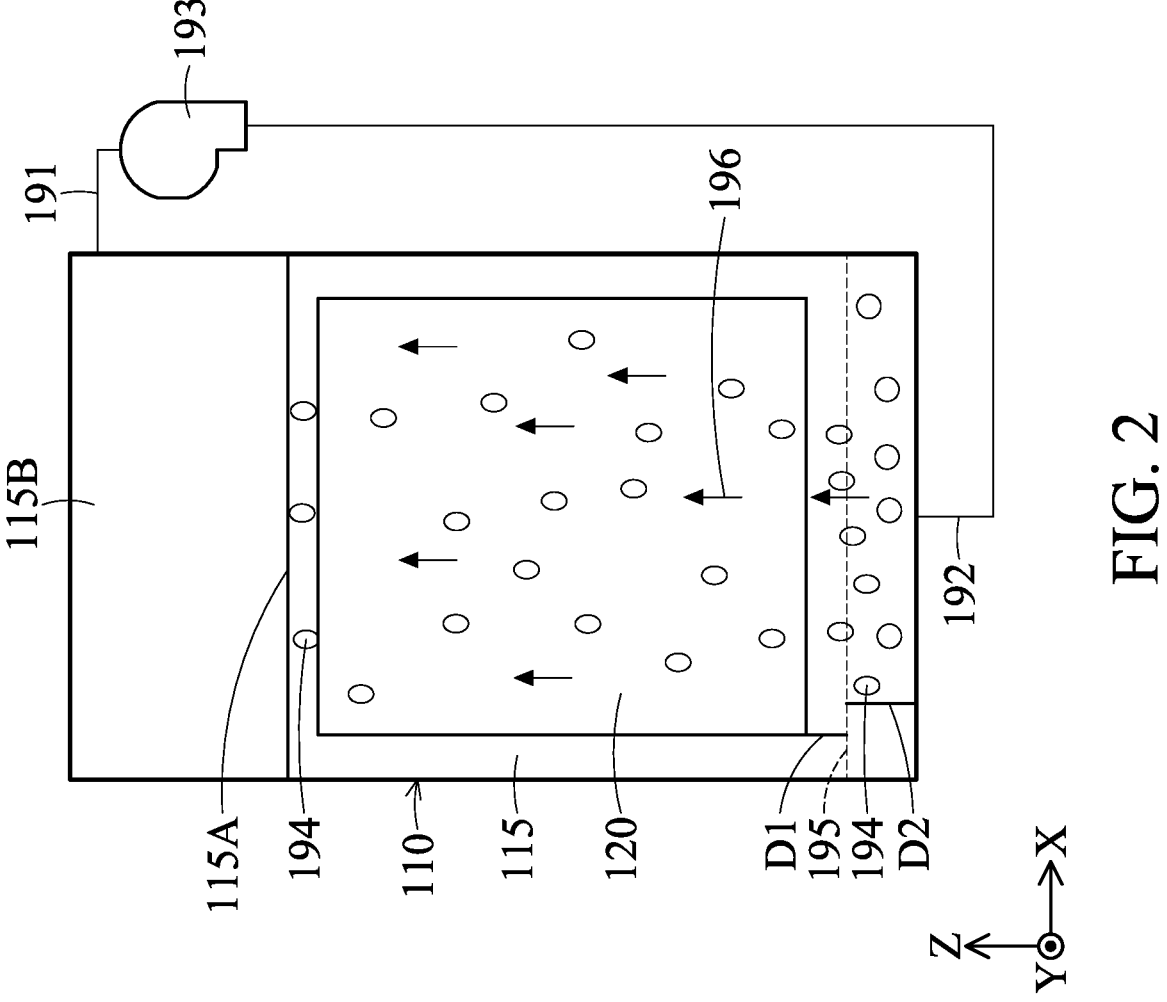
FIG. 2 illustrates a partial enlarged view of the immersion cooling system in accordance with some embodiments of the present disclosure.

FIG. 2 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure.

As shown in FIG. 2, the blower 193 is located outside the pressure seal tank 110, and the gas outlet 191 and the gas inlet 192 are located on different surfaces of the pressure seal tank 110, respectively. In some embodiments, the gas outlet 191 is located on the sidewall of the pressure seal tank 110 and is higher than the liquid level 115A of the cooling liquid 115. The gas inlet 192 is located on the bottom of the pressure seal tank 110, but the disclosure is not limited thereto. In other embodiments, the gas outlet 191 and the gas inlet 192 can be located on other surfaces or the same surface of the pressure seal tank 110, so that the gas 194 extracted by the blower 193 can pass through the distributor plate 195 to generate relatively uniform bubbles. In some embodiments, the distributor plate 195 includes a porous structure. For example, the distributor plate 195 can be made of zeolite, uniform gas supply structure or other suitable porous materials, but the present disclosure is not limited thereto.

In some embodiments, the blower 193 is positioned above liquid level 115A of cooling liquid 115. In this way, it can be ensured that the cooling liquid 115 will not flow into the blower 193, reducing the risk of damage to the blower 193. In some embodiments, the first distance D1 between the distributor plate 195 and the electronic module 120 may be less than the second distance D2 between the distributor plate 195 and the gas inlet 192, but the present disclosure is not limited thereto. In other embodiments, the first distance D1 between the distributor plate 195 and the electronic module 120 may be greater than or equal to the second distance D2 between the distributor plate 195 and the gas inlet 192. In some embodiments, the gas 194 is injected into the pressure seal tank 110 at a flow rate of about 0.05 m/s to about 0.5 m/s (that is, including 0.05 m/s, 0.5 m/s, and all values therebetween, such as 0.1 m/s, 0.2 m/s, etc.), but the present disclosure is not limited thereto. With the above configuration, a gas circulation can be formed in the pressure seal tank 110, wherein the flow of the gas 194 from bottom to top (such as shown by arrow 196) can increase the fluidity of the cooling liquid 115 (such as increase the flow rate), thereby significantly improving the heat dissipation effect on the electronic module 120.

Figure 3:
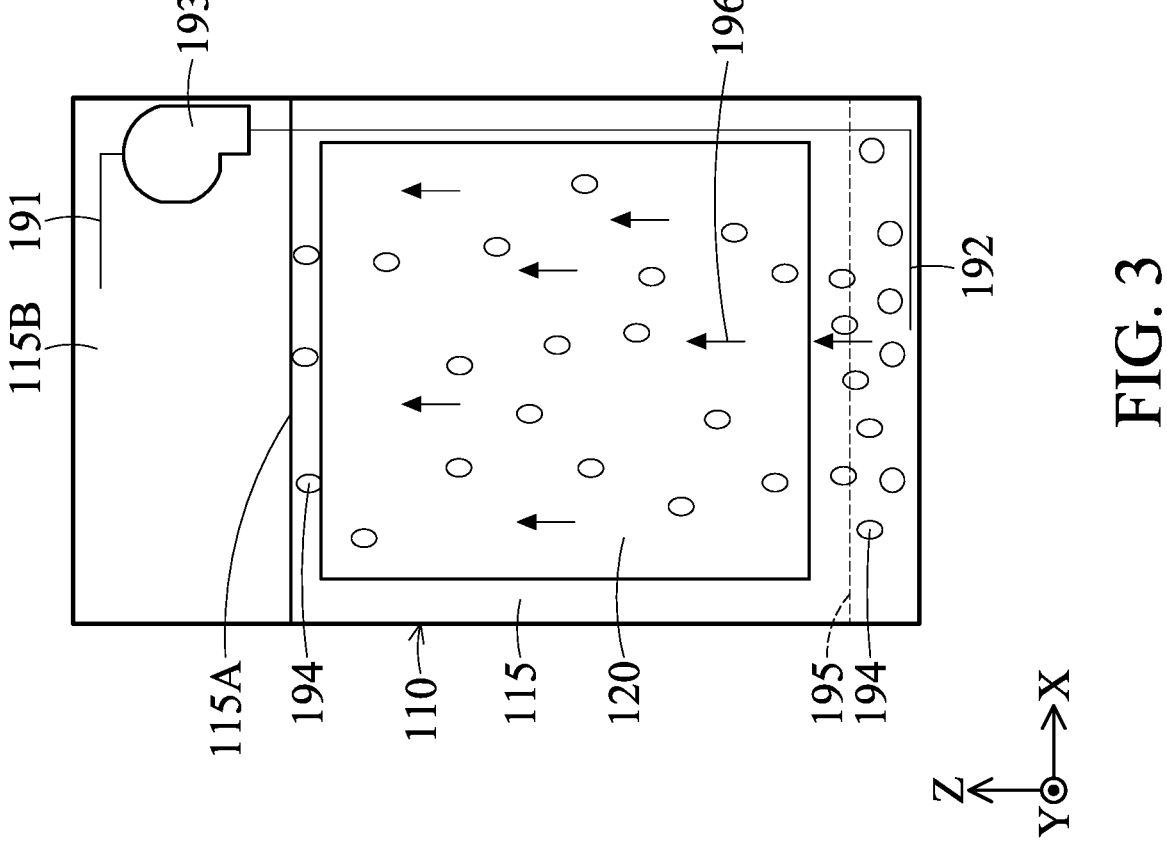
FIG. 3 illustrates a partial enlarged view of the immersion cooling system in accordance with some embodiments of the present disclosure.

FIG. 3 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure.

As shown in FIG. 3, the blower 193 is located inside the pressure seal tank 110, and the gas outlet 191 and the gas inlet 192 are respectively located on different sides of the pressure seal tank 110, but the present disclosure is not limited thereto. In other embodiments, the gas outlet 191 and the gas inlet 192 may be located on the other sides or the same side of the pressure seal tank 110 so that the gas 194 extracted by the blower 193 may pass through the distributor plate 195 to generate relatively uniform bubbles.

Similarly, the blower 193 is disposed higher than the liquid level 115A of the cooling liquid 115, thereby ensuring that the cooling liquid 115 will not flow into the blower 193, reducing the risk of damage to the blower 193. In some embodiments, the gas 194 is injected into the pressure seal tank 110 at a flow rate of about 0.05 m/s to about 0.5 m/s (that is, including 0.05 m/s, 0.5 m/s, and all values therebetween, such as 0.1 m/s, 0.2 m/s, etc.), but the present disclosure is not limited thereto. As mentioned above, a gas circulation can be formed in the pressure seal tank 110, wherein the flow of the gas 194 from bottom to top (such as shown by arrow 196) can increase the fluidity of the cooling liquid 115 (such as increase the flow rate), thereby significantly improving the cooling effect on the electronic module 120.

It should be understood that, although the above-mentioned embodiment is illustrated with the cooling liquid for heat dissipation as an example, it can also be applied to the cooling liquid for cooling in a similar manner, and will not be described in detail below.

As set forth above, the present disclosure provides an immersion cooling system having a distributor plate in the pressure seal tank. Specifically, the blower can extract gas from the gas outlet and inject the extracted gas back into the pressure seal tank via the gas inlet. The above-mentioned gas can pass through the distributor plate to generate relatively uniform bubbles. As a result, gas circulation can be formed in the pressure seal tank, thereby increasing the fluidity of the cooling liquid (for example, increasing the flow rate), and significantly improving the heat dissipation effect on the electronic module.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An immersion cooling system, comprising:
a pressure seal tank configured to contain a cooling liquid, wherein a gas outlet is disposed on a top or a sidewall of the pressure seal tank, and a gas inlet is disposed on a bottom of the pressure seal tank, wherein the gas outlet is higher than a liquid level of the cooling liquid;
an electronic module disposed in the pressure seal tank and immersed in the cooling liquid;
a blower communicating with the pressure seal tank and configured to extract a gas from the gas outlet and inject the gas into the pressure seal tank via the gas inlet; and
a distributor plate disposed in the pressure seal tank and located between the electronic module and the gas inlet, wherein the injected gas travels a second distance in the pressure seal tank to reach the distributor plate, and then travels a first distance from the distributor plate to the electronic module, wherein the first distance is less than the second distance.

2. The immersion cooling system as claimed in claim 1, wherein a vapor space is formed above the liquid level of the cooling liquid in the pressure seal tank; and
wherein the blower extracts the gas in the vapor space through the gas outlet.

3. The immersion cooling system as claimed in claim 1, wherein the blower is disposed higher than the liquid level of the cooling liquid.

4. The immersion cooling system as claimed in claim 1, wherein the distributor plate is disposed parallel to a bottom surface of the pressure seal tank.

5. The immersion cooling system as claimed in claim 1, wherein the blower is located in the pressure seal tank.

6. The immersion cooling system as claimed in claim 1, wherein the blower is located outside the pressure seal tank, and the gas inlet and the gas outlet are located on different surfaces of the pressure seal tank.

7. The immersion cooling system as claimed in claim 1, wherein the distributor plate comprises a uniform gas supply structure.

8. The immersion cooling system as claimed in claim 1, wherein the gas is injected into the pressure seal tank at a flow rate of 0.05 m/s to 0.5 m/s.

9. The immersion cooling system as claimed in claim 1, further comprising:
a heat exchanger communicating with the pressure seal tank and configured to receive the cooling liquid from the pressure seal tank for heat exchange and inject the cooling liquid into the pressure seal tank after the heat exchange; and

a pump connected to the heat exchanger and the pressure seal tank and outputting a propulsion to drive the cooling liquid.

10. The immersion cooling system as claimed in claim 9, wherein the pump is connected between a cooling liquid inlet of the heat exchanger and a cooling liquid outlet of the pressure seal tank, and the propulsion drives the cooling liquid to flow into the heat exchanger.

11. The immersion cooling system as claimed in claim 9, further comprising:
a cooling water source communicating with the heat exchanger and configured to supply cold water to the heat exchanger and receive the cold water from the heat exchanger after the heat exchange.

12. The immersion cooling system as claimed in claim 1, wherein the pressure seal tank further comprises a partition wall vertically disposed on the bottom of the pressure seal tank, and the distributor plate is connected to the partition wall.

13. The immersion cooling system as claimed in claim 12, wherein the liquid level of the cooling liquid is higher than the partition wall.

14. The immersion cooling system as claimed in claim 12, wherein partition wall divides the pressure seal tank into a first accommodating space and a second accommodating space, the electronic module and the gas inlet are located in the first accommodating space, and the cooling liquid flows into the first accommodating space and the second accommodating space.

15. The immersion cooling system as claimed in claim 1, wherein the gas outlet is located higher than the blower, and the gas inlet is located lower than the blower.

16. The immersion cooling system as claimed in claim 1, further comprising a relief valve communicating with the pressure seal tank, and the relief valve is automatically opened and closed for keeping a pressure value in the pressure seal tank from a first pressure value to a second pressure value.

17. The immersion cooling system as claimed in claim 16, wherein the first pressure value is about 103 kPa, and the second pressure value is about 101.5 kPa.

18. The immersion cooling system as claimed in claim 16, further comprising a pressure balance pipe disposed between the top of the pressure seal tank and the relief valve.

19. The immersion cooling system as claimed in claim 1, wherein the pressure seal tank further comprises an opening on the top of the pressure seal tank, and a sealing cover is configured to seal the opening.

* * * * *